(12) United States Patent
Stacey

(10) Patent No.: US 9,087,795 B2
(45) Date of Patent: Jul. 21, 2015

(54) INTERCONNECTION STRUCTURE

(75) Inventor: Simon Jonathan Stacey, Cambridgeshire (GB)

(73) Assignee: Cambridge Silicon Radio Limited, Cambridge (GB)

( * ) Notice: Subject to any disclaimer, the term of this patent is extended or adjusted under 35 U.S.C. 154(b) by 112 days.

(21) Appl. No.: 13/209,469

(22) Filed: Aug. 15, 2011

(65) Prior Publication Data

US 2012/0199967 A1    Aug. 9, 2012

(30) Foreign Application Priority Data

Aug. 18, 2010 (GB) .................................. 1013838.6

(51) Int. Cl.
*H01L 23/485* (2006.01)
*H05K 1/03* (2006.01)
(Continued)

(52) U.S. Cl.
CPC ........ *H01L 23/3114* (2013.01); *H01L 23/3142* (2013.01); *H01L 24/03* (2013.01); *H01L 24/05* (2013.01); *H01L 24/06* (2013.01); *H01L 23/3157* (2013.01); *H01L 24/13* (2013.01); *H01L 2224/0235* (2013.01); *H01L 2224/0239* (2013.01); *H01L 2224/02331* (2013.01); *H01L 2224/0345* (2013.01); *H01L 2224/0346* (2013.01); *H01L 2224/0401* (2013.01); *H01L 2224/05008* (2013.01); *H01L 2224/05011* (2013.01); *H01L 2224/05012* (2013.01); *H01L 2224/05015* (2013.01); *H01L 2224/05017* (2013.01); *H01L 2224/0519* (2013.01); *H01L 2224/05082* (2013.01); *H01L 2224/05124* (2013.01); *H01L 2224/05147* (2013.01); *H01L 2224/05558* (2013.01); *H01L 2224/05559* (2013.01); *H01L 2224/05647* (2013.01); *H01L 2224/06051* (2013.01); *H01L 2224/06131* (2013.01); *H01L 2224/13111* (2013.01); *H01L 2924/014* (2013.01); *H01L 2924/0105* (2013.01);
(Continued)

(58) Field of Classification Search
CPC ....... H01L 21/48; H01L 23/485; H01L 23/52; H01L 21/60; H01L 23/498; H01L 23/3114; H01L 24/03; H01L 24/05; H01L 24/06; H01L 23/3142; H05K 1/03
See application file for complete search history.

(56) References Cited

U.S. PATENT DOCUMENTS 6,323,542 B1   11/2001  Hashimoto
7,034,402 B1    4/2006  Seshan
(Continued)

FOREIGN PATENT DOCUMENTS

GB    2 444 775 A      6/2008
JP    2006-287048 A   10/2006
WO    2007/064073 A1   6/2007

OTHER PUBLICATIONS

UK Search Report dated Dec. 8, 2011 in corresponding UK Patent Application GB1013838.6.
UK Exam Report dated Jan. 29, 2014, in corresponding UK Patent Application GB1013838.6.

Primary Examiner — Walter H Swanson
(74) Attorney, Agent, or Firm — Vorys, Sater, Seymour and Pease LLP; Vincent M DeLuca

(57) ABSTRACT

An electrical interconnect for connecting an IC chip to a PCB, the electrical interconnect comprising a plurality of connection elements for connection to the PCB attached to a first surface of the electrical interconnect, wherein the amount of thermal and/or mechanical stress that each solder element connection can take before failing is improved.

17 Claims, 4 Drawing Sheets

(51) Int. Cl.
*H01L 23/31* (2006.01)
*H01L 23/00* (2006.01)

(52) U.S. Cl.
CPC ............ *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01051* (2013.01)

(56) References Cited

U.S. PATENT DOCUMENTS

| 2004/0070042 | A1 | 4/2004 | Lee et al. |
| 2006/0006480 | A1* | 1/2006 | Shinozaki et al. ............ 257/401 |
| 2007/0001301 | A1 | 1/2007 | Wang |
| 2010/0013093 | A1 | 1/2010 | Stacey |

* cited by examiner

INTERCONNECTION STRUCTURE

BACKGROUND OF THE INVENTION

This invention relates to an improved means for electrically connecting at least two components by means of a solder element. The improved means reduces the effect of thermal and mechanical stress on the join of the two components in comparison to conventional techniques.

Wafer Level Chip Scale Packages (WLCSPs) are used to connect a printed circuit board (PCB) to an integrated circuit (IC) chip. Commonly a WLCSP comprises at least one dielectric layer having solder elements on a first side. These solder elements are electrically connected to an IC chip on a second side of the dielectric by means of conductive traces extending through the layer. The solder elements can then be used for connection to a PCB or other substrate. Sometimes, multiple dielectric layers can be used. In this case, the IC chip is attached to a first dielectric layer and the solder element is attached to a second dielectric layer. Also, sometimes the pattern of the IC chip pads can be redistributed using the dielectric layer(s) and a conductive interconnection layer so that the solder elements on the first side form a standard array for interconnection.

However, the connection of the WLCSP to the PCB at the solder element join is not always reliable as the join is susceptible to failure from both mechanical and thermal stress. This failure could either occur in the join itself or in either the IC chip or the WLCSP if the stress is transmitted through the join. Failure by means of mechanical stress can be caused by mechanical vibrations in the device (from, for example, dropping the device). The susceptibility of the system to failure can be exacerbated when the IC technology requires the addition of low k dielectric layers. Low k dielectrics currently being used in this area can be brittle. The main source of thermal stress arises in mismatches in the coefficient of thermal expansion (CTE) between the IC and the PCB to which it is attached.

Several techniques are currently being implemented to reduce the amount of failures due to these kinds of stress.

One technique, which is the subject of pending US patent publication number US 2010/0013093, can involve adjusting the polymer materials and the thicknesses of the polymer layers to reduce the effect of stress.

Another option would be to use a modified solder composition which has an improved resistance to failure under stress.

Both of these techniques involve the specific selection of materials to be used.

SUMMARY OF THE INVENTION

It is an aim of the present invention to provide a means for connecting ICs to PCBs which has resistance to failure from stress and which can be used with a range of materials.

According to a first aspect of the present invention, there is an electrical interconnect comprising a first polymer layer, the first polymer layer defining a first surface of the electrical interconnect; a connection element, the connection element being attached to the first surface such that it protrudes from the first polymer layer; a connection pad separated from the connection element by at least the first polymer layer; and a collection of discrete conductive connections, the collection being arranged such that each discrete conductive connection in the collection electrically connects the connection element to the connection pad through the first polymer layer in parallel with other discrete conductive connections in the collection; and wherein the discrete conductive connections of the collection are further arranged such that at least part of each discrete conductive connection makes contact with the connection element directly underneath the connection element.

The electrical interconnect may comprise an interconnect structure located on a second surface of the first polymer layer, the discrete conductive connections being electrically connected to the connection pad through the interconnect structure and being arranged such that, in the plane defined by the first surface, the center point of the projection of the connection pad onto the first surface is offset from the center point of the projection of the connection element onto the same surface.

The electrical interconnect may comprise a second polymer layer located adjacent to the interconnect structure such that at least part of the interconnect structure is interposed between the first and second polymer layers; and a passivation layer located adjacent to the second polymer layer, the passivation layer containing the connection pad; wherein the interconnect structure extends through the second polymer layer to make electrical contact to the connection pad in the passivation layer.

The electrical interconnect may comprise a passivation layer that contains the connection pad, the passivation layer being located adjacent to the first polymer layer and wherein the connection pad is positioned in the passivation layer such that the projection of connection pad onto the plane defined by the first surface overlaps with at least part of the projection of the connection element onto the same surface.

The discrete conductive connections of the collection may extend through the first polymer layer along axes that are parallel to each other. These axes may be normal to the first surface.

The discrete conductive connections in the collection may have a circular cross-section. The circular cross-section of each discrete conductive connection may vary so as to give a frusto-conical shape to each conductive connection. The frusto-conical shape may be such that the circular cross sections of the collection of discrete conductive connections are all greatest in the plane defined by the first surface.

The electrical interconnect may comprise a plurality of connection elements each attached to the first surface of the electrical interconnect such that they protrude from the first polymer layer; a plurality of connection pads separated from the plurality of connection elements by at least the first polymer layer; and a plurality of collections of discrete conductive connections, wherein each of the plurality of connection elements is electrically connected to a respective one of the plurality of connection pads through the first polymer layer by a respective collection of discrete conductive connections, each of the conductive connections extending electrically in parallel with the other conductive connections of the respective collection.

The plurality of connection elements may be arranged in a systematic pattern such that the connection elements can be used to connect to a standard PCB interface.

The connection elements may be configured such that some have a greater ability to absorb mechanical and/or thermal stress before their join fails than other connection elements, said join being the connection between said connection element and the first polymer layer. The ability of each connection element to absorb mechanical and/or thermal stress may be determined by the quantity of conductive connections in each connection elements' respective collection of discrete conductive connections. The said quantity of conductive connections may vary with respect to the distance of each particular connection element from the neutral point of the plurality of connection elements. The parts of the electrical interconnect that lie directly beneath connection elements that are further away from the neutral point of the plurality of connection elements may have a greater ratio of first polymer layer material to conductive connection material than the parts of the electrical interconnect that lie directly below connection elements closer to the neutral point of the electrical interconnect The conductive connections may be arranged in a radial array.

Each connection pad may form part of an IC chip.

The electrical interconnect may be connected to IC chips, each IC chip being electrically connected to respective connection pads that are further electrically connected to respective connection elements.

The first and second polymer layers may be flexible.

The connection element may be comprised of a solder element and a metallic element, the metallic element being such that it is able to adhere the solder element to the first polymer layer.

The metallic element may comprise copper.

DETAILED DESCRIPTION OF THE INVENTION

Figure 1:
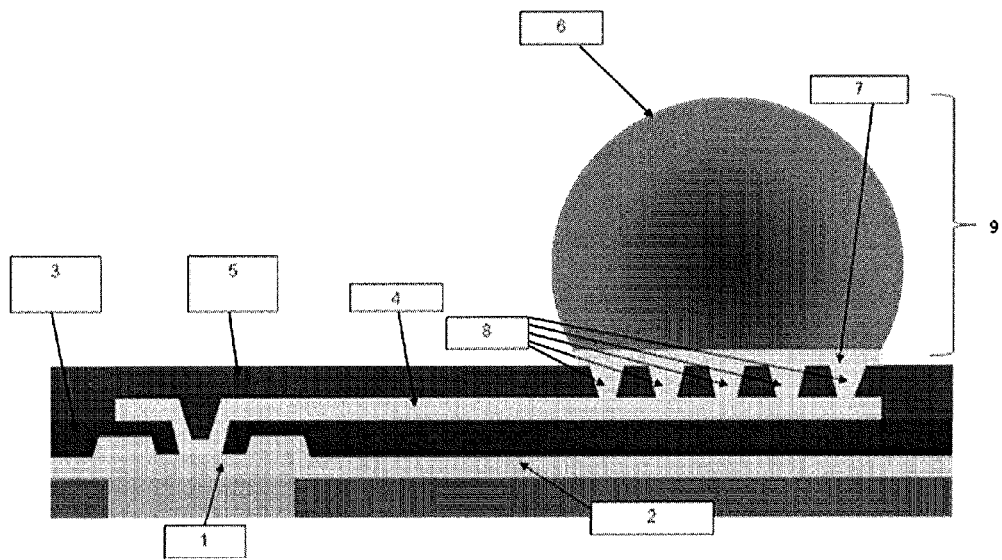
FIG. 1 shows a cross sectional view of a WLCSP with a plated metal redistribution and under bump metallisation scheme.

The present invention will now be disclosed by way of example.

Traditionally a conducting via connects a solder element to a device through a body of separating material, where the separating material is usually a dielectric. This can be achieved either by a direct connection or by an indirect connection. A direct connection is where the solder element directly overlies the pad to which it is to be connected (the connection pad) and a conductive via extends between the solder element and the connection pad. An indirect connection is where the solder element is electrically connected to the connecting pad through a redistribution layer. The solder element is electrically connected to the redistribution layer by means of a conductive via. The redistribution layer routes the electrical connection away from regions located directly beneath the solder element. This means that the connection pad does not need to be located directly beneath the solder element and so the solder elements can be arranged in a different pattern to the connection pads. The main concept in both of these techniques is the use of a single conductive via extending through the body of separating material from the attaching solder element.

In contrast, the technique outlined below proposes the use of several conducting vias extending through the body of separating material from the same attaching solder element. The group of discrete conductive vias directly underlying a single solder element is known herein as a collection of discrete conductive connections. Using a collection of discrete conductive connections in this way is advantageous as it introduces some of the separating body into regions between the discrete connections. The separating body commonly has properties that result in a greater ability to accommodate thermal mismatches between it and bodies attached to it than the conductive material used in the discrete conductive connections. Therefore, introducing regions of separating body into regions of the electrical interconnect directly below the solder element can reduce the effect of thermal stress caused by mismatches between the CTE of the conductive material in the conducting via hole and the CTE of the separating material.

The technique of using a collection of discrete conductive collections per solder element is particularly useful for solder elements further away from the neutral point of the device. This is because the body of dielectric to which the solder element is attached may expand or contract based on the temperature of the surroundings. The neutral point is considered to be the point at which there is no relative expansion or contraction between two adjacent components. A solder element placed at that position would be expected to remain centerd on that position and be subject to very little stress from this effect. However, solder elements further away from the neutral point would be expected to be moved relative to the neutral point, subjecting them to an increased amount of thermal stress. It is therefore advantageous to make those solder elements further away from the neutral point able to absorb more mechanical and/or thermal stress before failing than those solder elements closer to the neutral point. Using the present teachings, this can be achieved by the designer choosing the number of conductive connections in each collection such that solder elements further away from the neutral point can comprise a greater quantity of separating body directly underneath them than those solder elements closer to the neutral point. This principle is illustrated in FIG. 6 and is discussed further later in the description.

The presence of the separating material between the discrete conductive connections also assists in reducing the mechanical stress. It is believed that this is because the presence of the separating material with appropriate properties provides for a less rigid connection through the material than a single conductive via would. The less rigid connection used in this technique allows for the solder element to be subject to an increased amount of flexing and vibration before failure occurs than with conventional single conductive vias. Also, using a collection of discrete conductive connections increases the reliability of the device as it becomes less important if one of the conductive connections in the collection should fail. Therefore, the new system has an increased resistance to mechanical stress.

The invention will now be further elaborated with reference to specific embodiments. Features in the different embodiments that are labelled with the same reference numeral are equivalent to each other.

FIG. 1 shows a structure having a connection pad 1 of an IC chip inset into a passivation layer 2. The passivation layer 2 acts as a protection layer for the IC chip. The structure has a first polymer layer 5 and a second polymer layer 3. The second polymer layer 3 overlies the passivation layer 2. A conductive interconnect structure 4 overlies the second polymer layer 3. In at least part of the region directly above the connection pad 1, the interconnect structure 4 extends through a via in the second polymer layer 3 and makes electrical contact with the connection pad 1. A first polymer layer 5 is located over the interconnect structure 4 so that the interconnect structure 4 lies between the first and second polymer layers (5,3). A connection element 9 is attached to the first polymer layer 5 on an opposite surface to the interconnect structure 4. The surface to which the connection element is attached is known as the first surface of the first polymer layer. The connection element 9 protrudes from the first surface. The connection element 9 comprises a solder element 6 and an under bump metallisation (UBM) 7. The connection element 9 can make electrical contact with the interconnect structure 4 by means of an electrical connection that extends through a via in the first polymer layer 5 from the connection element 9 to the interconnect structure 4. In FIG. 1, this electrical connection comprises a collection of discrete conductive connections 8 that extend through vias in the first polymer layer 5 between the UBM 7 and the metallised interconnect 4.

Preferably, the interconnect structure 4 is used such that the central axis of the conductive element 9 does not align with the central axis of the connection pad 1. The central axis of each feature extends through the first and second polymer layers (5,3), is normal to at least one of the faces of both the first and second polymer layers (5,3) and also passes through the center point of its respective feature.

Preferably, the discrete conductive connections 8 extend through regions that are neither directly above nor directly below the connection pads 1.

Figure 2:
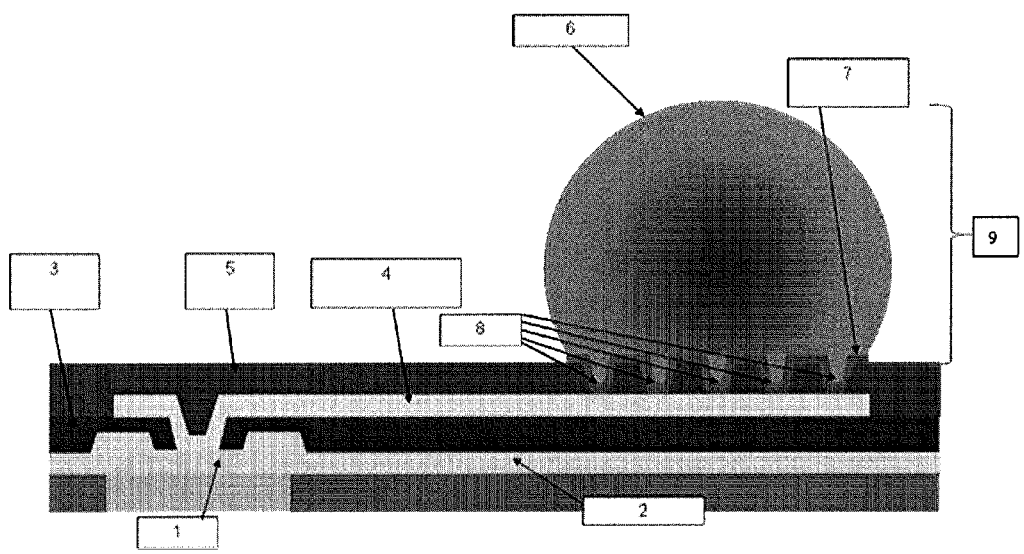
FIG. 2 shows a cross sectional view of a WLCSP with a sputtered metal redistribution and under bump metallisation scheme.

FIG. 2 shows a similar structure to FIG. 1. A connection pad 1 of an IC chip is inset into a passivation layer 2, over which lies a second polymer layer 3. An interconnect structure 4 lies over this second polymer layer 3, separating at least part of the second polymer layer 3 from a first polymer layer 5. In the region directly above the connection pad 1, the interconnect structure 4 extends through vias in the second polymer layer 3 to make electrical contact with the connection pad 1. In a different region of the device, a solder element 6 is attached to the first polymer layer by means of a UBM 7. Together, they form a connection element 9. An electrical connection is made between the solder connection element 9 and the interconnect structure 4 by a collection of discrete conductive connections 8. This collection 8 extends through the first polymer layer 5 from the connection element 9 to the interconnect structure 4.

The primary difference between FIGS. 1 and 2 is that, in FIG. 2, the UBM and conductive connections are metallised by a sputtering technique whereas in FIG. 1 the UBM and conductive connections are metallised using a plating technique.

Traditional sputtering techniques deposit thin (typically <1 μm thick) metal layers which, dependent on the conductive connection diameter and the first polymer thickness, may be insufficient to fill the conductive connections in the first polymer layer. Therefore conductive connections filled by sputtered metal techniques commonly also include some solder from the solder element. In such a case the supporting material beneath the solder element is a composite structure of polymer, solder and sputtered metal. As a result, devices formed using sputtering techniques can include a compliant composite structure formed from the combination of the polymer, the solder and the sputtered metal in the UBM. In contrast, traditional plating techniques deposit relatively thick (typically >2 μm thick) metal layers which, dependent on the conductive connection diameter and the first polymer thickness, may be sufficient to fill the conductive connections in the first polymer layer. In such a case, if the conductive connection is filled by plated metal only, the supporting material beneath the solder element is a composite structure of polymer and plated metal. As a result devices formed using plating techniques can include a compliant composite structure formed from the combination of the polymer and the plated metal.

Therefore, FIG. 1 illustrates a device which includes a compliant composite structure formed from the combination of the polymer and the plated metal whilst, in contrast, FIG. 2 illustrates a device which includes a compliant composite structure formed from the combination of the polymer, the solder and the sputtered metal in the UBM.

Figure 3:
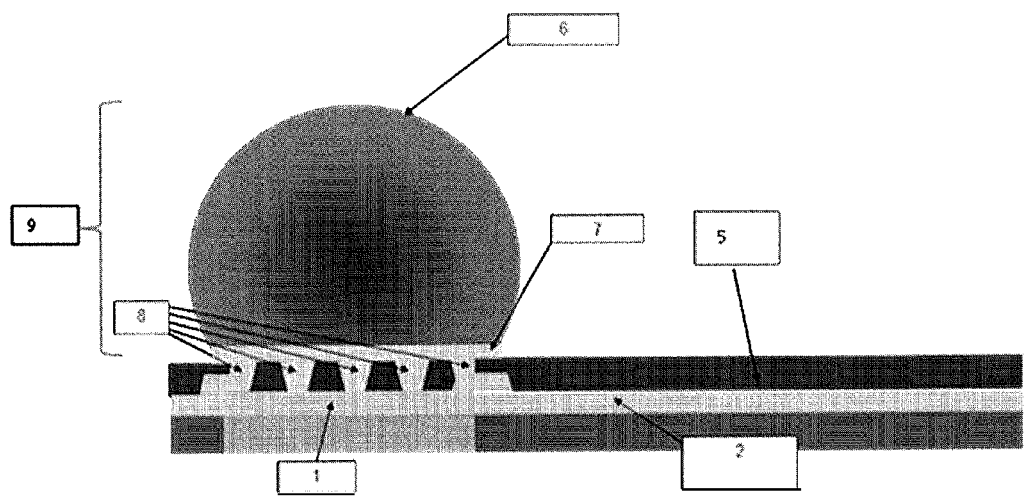
FIG. 3 shows a cross sectional view of a WLCSP with plated metal repassivated scheme.

FIG. 3 shows a connection pad 1 of an IC chip inset into a passivation layer 2. A first polymer layer 5 overlies this passivation layer 2. In a region directly over the connection pad 1, a solder element 6 is attached to this first polymer layer 5 by a UBM 7. Together, the solder element/UBM combination is known as a connection element 9. The connection element 9 makes an electrical connection with the connection pad 1 by means of a collection of discrete conductive connections 8. These discrete conductive connections 8 extend through the first polymer layer 5 to the connection pad 1 from the connection element.

Preferably, the connection element 9 and the connection pad 1 share a common central axis. The common central axis is an axis that extends through the central mid-points of the solder element 6, the UBM 7 and the connection pad 1. Preferably, if the discrete conductive connections 8 are arranged in a systematic pattern in their collection, such as a radial array, the central point of this pattern also lies along the common central axis.

Figure 4:
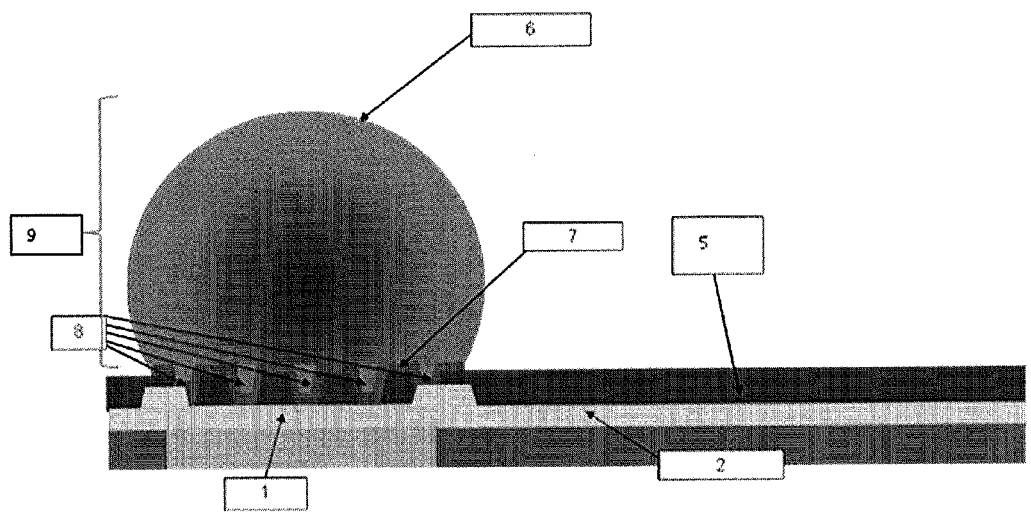
FIG. 4 shows a cross sectional view of a WLCSP with sputtered metal repassivated scheme.

FIG. 4 shows a similar structure to FIG. 3. A connection pad 1 of an IC chip is inset into a passivation layer 2. A first polymer layer 5 overlies this passivation layer 2 so that it is separated from the IC chip by the passivation layer 2. A solder element 6 is attached to the first polymer layer 5 by means of a UBM 7. The solder element/UBM combination is known as a connection element 9. The connection element 9 is attached in such a way that it is electrically connected to the connection pad 1 by a collection of discrete conductive connections 8. The discrete conductive connections 8 extend through the first polymer layer 5 from the connection element 9 and towards the connection pad 1.

FIG. 3 differs from FIG. 4 in that the UBM and conductive connections in FIG. 4 are preferably formed by a sputtering technique whereas in FIG. 3 the UBM and conductive connections are metallised using a plating technique. Therefore, for similar reasons to those described in relation to FIGS. 1 and 2, FIG. 3 illustrates a device which includes a compliant composite structure formed from the combination of the polymer and the plated metal whilst, in contrast, FIG. 4 illustrates a device which includes a compliant composite structure formed from the combination of the polymer, the solder and the sputtered metal in the UBM.

The following features can be applied to any of the above described embodiments where the components used exist.

Preferably, the discrete conductive connections 8 extend to the interconnect structure 4 geometrically parallel to each other.

Preferably, the conductive connections 8 have a circular cross-section. More preferably, the conductive connections have a frusto-conical shape, with the largest circular cross-section of the frusto-cone being closer to the connection element 9 than the smallest circular cross-section.

Preferably, the closest cross-section of each discrete conductive connection 8 to its respective connection element 9 is much smaller than the area of the UBM 7.

Preferably, the UBM 7 has a finish that allows it to wet to the solder element 6. Preferably, this wettable finish is copper.

Preferably there are multiple connection pads 1, each connected to a respective connection element 9. Preferably, these connection elements 9 are arranged into an array. More preferably, this array is a universal array suitable for interconnection to a standard PCB interface. Further, this array may comprise connection elements 9 spaced at a pitch of 0.5 mm or less, or at a pitch of 0.4 mm or less.

Preferably the connection pads 1 are aluminium pads.

Preferably, the solder elements 6 are tin based solder elements. More preferably, the solder elements 6 have a composition of about 4% wt. Silver, and about 0.5% wt. Copper, although the invention is not limited to use with this composition and advantages of the invention can be gained when other compositions are used.

Preferably, the solder elements 6 are solder balls or solder bumps.

Preferably, the passivation layer 2 is either SiO or SiN.

Preferably the interconnect structure 4 is copper or aluminium.

Figure 5A:
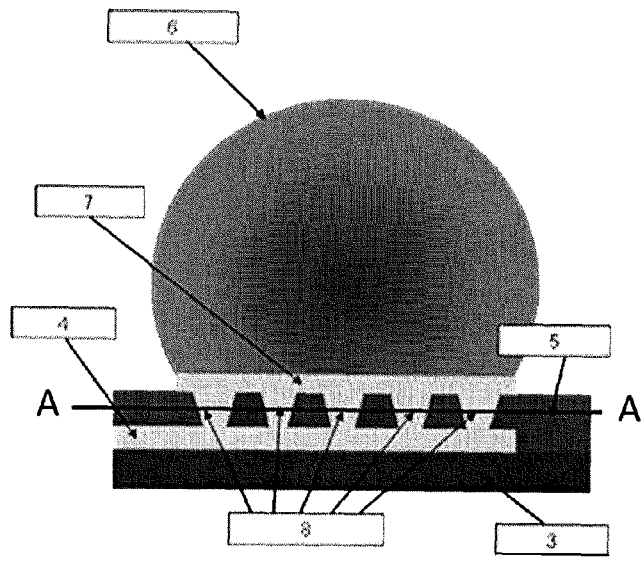
FIG. 5A shows a cross sectional view of a WLCSP.
Figure 5B:
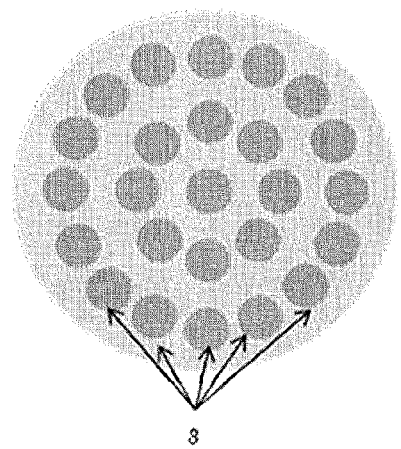
FIG. 5B shows an example of a type of array the discrete conductive connections in a collection may be arranged in, viewed across the line A-A in FIG. 5A.

Preferably, the discrete conductive connections of a collection 8 are arranged in a systematic pattern. Preferably this systematic pattern is an array, such as the radial array illustrated in FIG. 5B. FIG. 5B is a view taken along the line A-A in FIG. 5A.

The quantity of the discrete conductive connections in a collection 8 associated with a connection element 9 can determine the ability of the connection element 9 to absorb mechanical and/or thermal stress. Therefore, the designer may vary the quantity of discrete conductive connections 8 in a collection to accommodate expected stresses at that point. The ability can further be determined by, for example, how the discrete conductive connections 8 in the collection are arranged relative to each other and/or the shape/size of the discrete conductive connections 8 at the point where they make contact with the connection element 9. Some of these ideas are illustrated in FIG. 6.

Figure 6A:
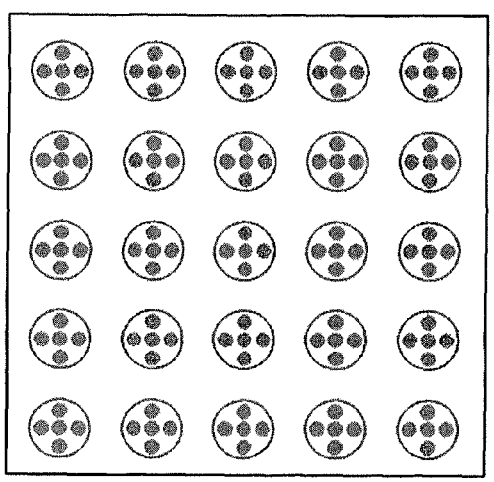
FIG. 6A shows how an array pattern used for a collection of discrete conductive connections can be repeated across multiple collections across the IC.

FIG. 6A illustrates a plurality of collections of discrete conductive connections where the discrete conductive connections in each collection are arranged in a radial array.

Figure 6B:
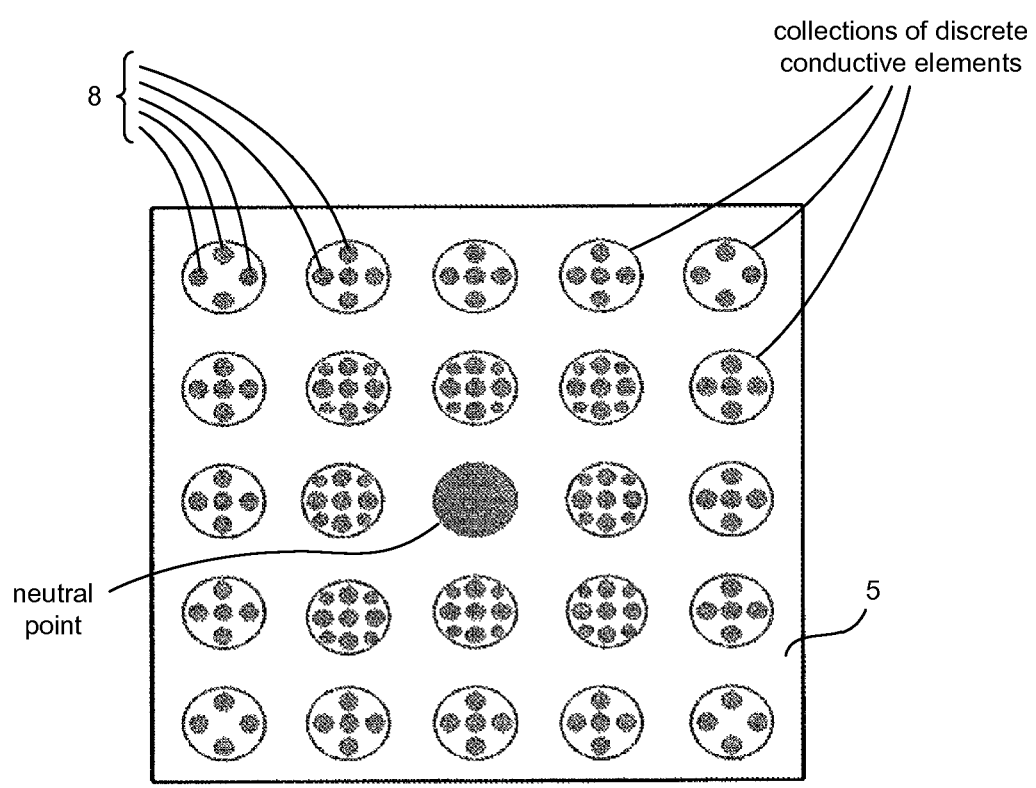
FIG. 6B shows how the array pattern selected for each collection of discrete conductive connections can change across the IC depending on the IO DNP.

FIG. 6B illustrates a possible design a designer may use with different sizes and quantities of discrete conductive connections per collection, their position relative to the neutral point of the solder element array. FIG. 6B also demonstrates how the design of the conductive connection array may vary depending on the distance to neutral point (DNP) across the solder element array. Conductive connections 8 are associated with respective connection elements 9. The connection elements 9 are formed in an array on a polymer layer 5. The neutral point of the solder element array can be defined as the position at which, if a connection element 9 were centered on that position, the connection element 9 would be expected to be subject to a lower amount of thermal stress as the temperature varies than it would be if positioned anywhere else on the same surface and exposed to the same temperature range. The neutral point refers to a position where there is no relative expansion or contraction between two adjacent components. If the pattern of the discrete conductive connections in each collection is varied in this manner, connection elements 9 with a higher DNP can be provided with an increased ability to absorb thermal/mechanical stress than those with a lower DNP. This reduces stress in the solder element 6, the WLCSP layers and/or the silicon IC. The ability to absorb mechanical and/or thermal stress can be further modified by adjusting the UBM 7 material(s), size and thicknesses; solder materials and size; polymer material(s) and thicknesses.

The discrete conductive connections can be arranged so that they extend electrically in parallel to each other from the connection element to the connection pad. The discrete conductive connections can be arranged so that each discrete conductive connection is physically isolated from all other discrete conductive connections by the first polymer layer material. The discrete conductive connections can be arranged such that each discrete conductive connection connects a connection pad to a connection element electrically in parallel with other discrete conductive connections and can further be arranged so that each discrete conductive connection contacts the connection element, the connection pad or both the connection element and the connection pad. The discrete conductive connections can be arranged so that each discrete conductive connection extends in a direction normal to the first surface.

During manufacture, the structure is preferably formed by depositing the first polymer layer after the deposition of the second polymer layer.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electrical interconnect comprising;
    a first polymer layer, the first polymer layer defining a first surface of the electrical interconnect;
    a plurality of connection elements, each connection element being attached to the first surface such that each connection element protrudes from the first polymer layer;
    a plurality of connection pads separated from the plurality of connection elements by at least the first polymer layer; and
    a plurality of collections of discrete conductive connections, each collection being associated with a particular connection element, and each collection being arranged such that each discrete conductive connection in that collection electrically connects said particular connection element of the plurality of connection elements to a connection pad of the plurality of connection pads through the first polymer layer in parallel with other discrete conductive connections of the plurality of discrete conductive connections in that collection;
    wherein the discrete conductive connections are further arranged such that at least part of each discrete conductive connection makes contact with said particular connection element directly underneath that connection element;
    wherein a quantity of conductive connections in each connection element's respective collection of discrete conductive connections varies with respect to a distance of each particular connection element from a neutral point of the plurality of connection elements, said neutral point being a position on said first surface at which a connection element of said plurality of connection elements would be subjected to a lower amount of thermal stress as temperature varies than it would be if positioned elsewhere on said first surface; and wherein parts of the electrical interconnect that lie directly beneath the connection elements, which are further away from the neutral point of the plurality of connection elements, have a greater ratio of first polymer layer material to conductive connection material than parts of the electrical interconnect that lie directly below connection elements closer to the neutral point of the electrical interconnect.

2. The electrical interconnect as claimed in claim 1, wherein the electrical interconnect further comprises an interconnect structure located on a second surface of the first polymer layer, the discrete conductive connections being electrically connected to the connection pad through the interconnect structure and being arranged such that, in a plane defined by the first surface, a center point of a projection of the connection pad onto the first surface is offset from a center point of a projection of the connection element onto the first surface.

3. The electrical interconnect as claimed in claim 2, wherein the electrical interconnect further comprises;
a second polymer layer located adjacent to the interconnect structure such that at least part of the interconnect structure is interposed between the first and second polymer layers; and
a passivation layer located adjacent to the second polymer layer, the passivation layer containing the connection pad;
wherein the interconnect structure extends through the second polymer layer to make electrical contact to the connection pad in the passivation layer.

4. The electrical interconnect as claimed in claim 1, wherein the electrical interconnect further comprises a passivation layer that contains the connection pad, the passivation layer being located adjacent to the first polymer layer and wherein the connection pad is positioned in the passivation layer such that a projection of the connection pad onto a plane defined by the first surface overlaps with at least part of a projection of the connection element onto the first surface.

5. The electrical interconnect as claimed in claim 1, wherein the discrete conductive connections of the collection extend through the first polymer layer along axes that are parallel to each other.

6. The electrical interconnect as claimed in claim 5, wherein said axes are normal to the first surface.

7. The electrical interconnect as claimed in claim 5, wherein each of the discrete conductive connections in the collection has a circular cross-section.

8. The electrical interconnect as claimed in claim 7, wherein the circular cross-section of each discrete conductive connection varies so as to give a frusto-conical shape to each conductive connection.

9. The electrical interconnect as claimed in claim 8, wherein the frusto-conical shape is such that the circular cross sections of the collection of discrete conductive connections are all greatest in a plane defined by the first surface.

10. The electrical interconnect as claimed in claim 1, wherein each of the plurality of connection elements is electrically connected to a respective one of the plurality of connection pads through the first polymer layer by a respective collection of discrete conductive connections, each of the conductive connections extending electrically in parallel with the other conductive connections of the respective collection.

11. The electrical interconnect as claimed in claim 10, wherein the plurality of connection elements is arranged in a systematic pattern such that the connection elements can be used to connect to a standard PCB interface.

12. The electrical interconnect as claimed in claim 1, wherein the conductive connections are arranged in a radial array.

13. The electrical interconnect as claimed in claim 1, wherein each connection pad forms part of an IC chip.

14. The electrical interconnect as claimed in claim 1, wherein the electrical interconnect is connected to IC chips, each IC chip being electrically connected to the respective connection pads that are further electrically connected to the respective connection elements.

15. The electrical interconnect as claimed in claim 1, wherein the first and second polymer layers are flexible.

16. The electrical interconnect as claimed in claim 1, wherein the connection element is comprised of a solder element and a metallic element, the metallic element being such that it is able to adhere the solder element to the first polymer layer.

17. The electrical interconnect as claimed in claim 16, wherein the metallic element comprises copper.

* * * * *